(12) United States Patent
Maheshwari

(10) Patent No.: US 9,576,630 B2
(45) Date of Patent: Feb. 21, 2017

(54) MEMORY DEVICES AND METHODS HAVING MULTIPLE ADDRESS ACCESSES IN SAME CYCLE

(75) Inventor: Dinesh Maheshwari, Fremont, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 216 days.

(21) Appl. No.: 13/179,307

(22) Filed: Jul. 8, 2011

(65) Prior Publication Data

US 2012/0008378 A1   Jan. 12, 2012

Related U.S. Application Data

(60) Provisional application No. 61/363,151, filed on Jul. 9, 2010.

(51) Int. Cl.
*G11C 8/18* (2006.01)
*G11C 8/16* (2006.01)

(52) U.S. Cl.
CPC .. *G11C 8/16* (2013.01); *G11C 8/18* (2013.01)

(58) Field of Classification Search
CPC ............ G11C 8/16; G11C 8/18; G11C 7/1042
USPC ............. 365/230.05, 230.03, 185.11, 230.04
See application file for complete search history.

(56) References Cited

U.S. PATENT DOCUMENTS

| | | | |
|---|---|---|---|
| 4,796,232 A * | 1/1989 | House | 365/189.03 |
| 4,887,240 A | 12/1989 | Garverick et al. | |
| 5,875,470 A * | 2/1999 | Dreibelbis et al. | 711/147 |
| 5,991,230 A * | 11/1999 | Urakawa | G11C 7/22 365/189.05 |
| 6,166,946 A | 12/2000 | Naffziger | |
| 6,205,523 B1 | 3/2001 | Joffe et al. | |
| 6,272,067 B1 | 8/2001 | Sun et al. | |
| 6,314,047 B1 | 11/2001 | Keay et al. | |
| 6,324,104 B1 | 11/2001 | Matsui | |
| 6,381,684 B1 | 4/2002 | Hronik et al. | |
| 6,489,819 B1 | 12/2002 | Kono et al. | |
| 6,584,036 B2 | 6/2003 | Kurjanowicz et al. | |
| 6,600,693 B2 | 7/2003 | Kim | |
| 6,745,277 B1 | 6/2004 | Lee et al. | |
| 6,967,861 B2 | 11/2005 | Braceras et al. | |
| 7,142,477 B1 * | 11/2006 | Tran et al. | 365/230.02 |
| 7,653,780 B2 | 1/2010 | Takahashi | |
| 7,990,973 B2 | 8/2011 | Hao et al. | |
| 8,149,643 B2 * | 4/2012 | Tzou et al. | 365/230.03 |
| 8,705,310 B2 | 4/2014 | Tran et al. | |
| 2001/0017792 A1 | 8/2001 | Takahashi et al. | |

(Continued)

FOREIGN PATENT DOCUMENTS

JP   2009059452 A   3/2009

OTHER PUBLICATIONS

USPTO Non Final Rejection for U.S. Appl. No. 13/727,505 dated Oct. 24, 2013; 12 pages.

(Continued)

*Primary Examiner* — Khamdan Alrobaie

(57) ABSTRACT

A memory device can include a plurality of banks, each bank including memory locations accessible by different access circuits; at least a first address port configured to receive addresses on falling and rising edges of a timing clock, each address corresponding to locations in different banks; and at least two read/write data ports configured to receive write data for storage in one of the banks, and output read data from one of the banks.

22 Claims, 12 Drawing Sheets

(56) References Cited

U.S. PATENT DOCUMENTS

| | | | |
|---|---|---|---|
| 2004/0240288 A1* | 12/2004 | Takahashi | ............... 365/202 |
| 2005/0210215 A1 | 9/2005 | Sezaki et al. | |
| 2006/0193160 A1 | 8/2006 | Hanzawa et al. | |
| 2006/0292292 A1 | 12/2006 | Brightman et al. | |
| 2008/0133809 A1 | 6/2008 | Saito et al. | |
| 2009/0282316 A1 | 11/2009 | Lingam et al. | |
| 2009/0323454 A1 | 12/2009 | Noh | |
| 2010/0103762 A1* | 4/2010 | Tzou et al. | ............ 365/230.03 |
| 2011/0058421 A1 | 3/2011 | Warren | |
| 2012/0008378 A1 | 1/2012 | Maheshwari | |
| 2012/0243301 A1 | 9/2012 | Maheshwari et al. | |
| 2014/0340978 A1 | 11/2014 | Tran et al. | |

OTHER PUBLICATIONS

Altera Corporation, QDR SRAM Controller Function, Application Note 133, ver 1.0, Dec. 2000.

Altera Corporation, "QDR SRAM Controller Reference Design for Stratix & Stratix GX Devices", Application Note 349, ver 1.0, May 2004.

U.S. Appl. No. 13/727,505: "Access Methods and Circuits for Memory Devices Having Multiple Banks" Thinh Tran et al., filed Dec. 26, 2012; 27 pages.

U.S. Appl. No. 14/866,260: "Access Methods and Circuits for Memory Devices Having Multiple Channels and Multiple Banks," Jun Li et al., filed Sep. 25, 2015; 38 pages.

English machine translation of JP2009095452 taken from Internet:http://worldwide.espacenet.com.

Interfacing XILINX SPARTAN-II FPGA,http://www.datasheets.org.uk/CY7C1302_CY7C1304/Datasheet-09/DSA00154448.html; 3 pages.

International Search Report for International Application No. PCT/US2011/043481 dated Jan. 2, 2012; 3 pages.

USPTO Advisory Action for U.S. Appl. No. 13/727,505 dated Aug. 26, 2013; 3 pages.

USPTO Final Rejection for U.S. Appl. No. 14/258,950 dated Aug. 17, 2015; 19 pages.

USPTO Final-Rejection for U.S. Appl. No. 13/727,505 dated Jul. 10, 2013; 15 pages.

USPTO Non-Final Rejection for U.S. Appl. No. 13/727,505 dated Mar. 15, 2013; 24 pages.

USPTO Non-Final Rejection for U.S. Appl. No. 14/258,950 dated Nov. 7, 2014; 19 pages.

USPTO Notice of Allowance for U.S. Appl. No. 13/727,505 dated Feb. 6, 2014; 8 pages.

White Electronics Design Corporation,"SSRAM Overview Application Note", Oct. 2001. 6 pages.

Written Opinion of the International Searching Authority for International Application No. PCT/US2011/043481 mailed Jan. 2, 2012; 4 pages.

U.S. Appl. No. 14/258,950: "Access Methods and Circuits For Memory Devices Having Multiple Banks," Thinh Tran et al., filed on Apr. 22, 2014; 27 pages.

SIPO Office Action for Application No. 201110263752.3 dated Apr. 5, 2016; 6 pages.

USPTO Notice of Allowance for U.S. Appl. No. 14/258,950 dated Mar. 2, 2016; 8 pages.

USPTO Notice of Allowance for U.S. Appl. No. 14/258,950 dated Jun. 21, 2016; 9 pages.

USPTO Notice of Allowance for U.S. Appl. No. 14/258,950 dated Oct. 27, 2015; 8 pages.

USPTO Notice of Allowance for U.S. Appl. No. 14/866,260 dated Feb. 4, 2016; 9 pages.

USPTO Notice of Allowance for U.S. Appl. No. 14/866,260 dated Jun. 2, 2016; 10 pages.

USPTO Notice of Allowance for U.S. Appl. No. 14/866,260 dated Sep. 14, 2016; 10 pages.

* cited by examiner

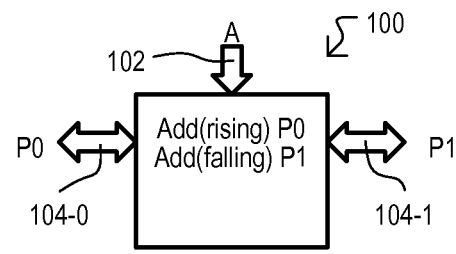
FIG. 1A
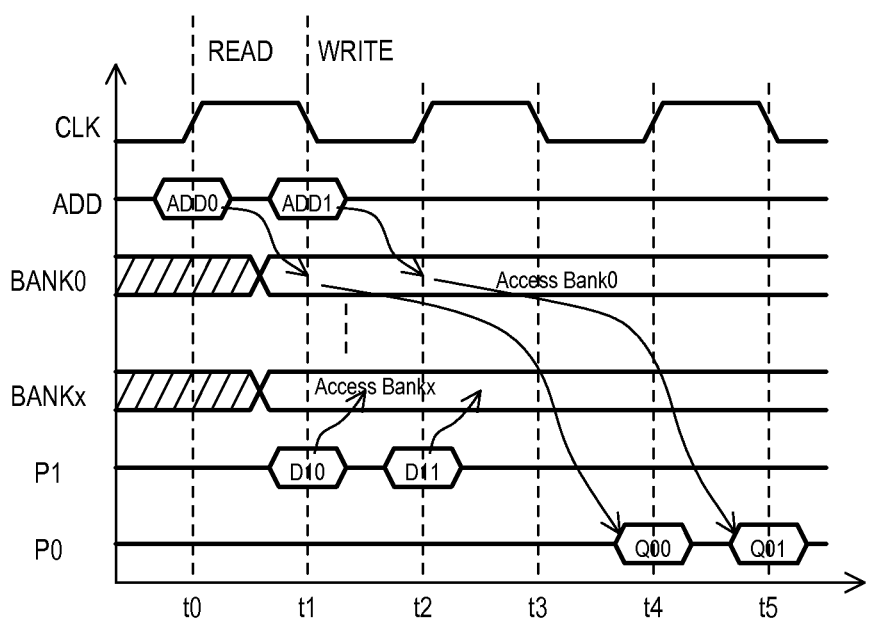
FIG. 1B
FIG. 1C

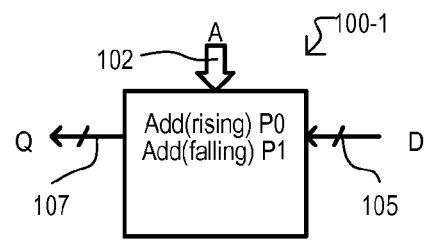
FIG. 1D
| | B2A2b |
|---|---|
| DATA BURST | 2 |
| #ADD/CYCLE | 2 banked |
| # READ PORTS | 1 |
| # WRITE PORTS | 1 |
| R_W/CYCLE/BANK | 1 |
| BANKS | 2/4/8 |
| R_W/CYCLE/BANK | 1 |
FIG. 1E
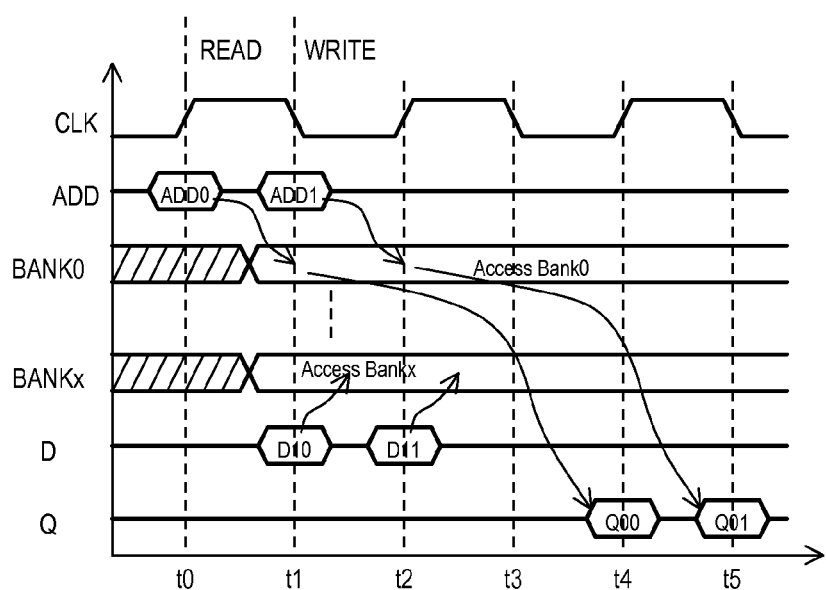
FIG. 1F

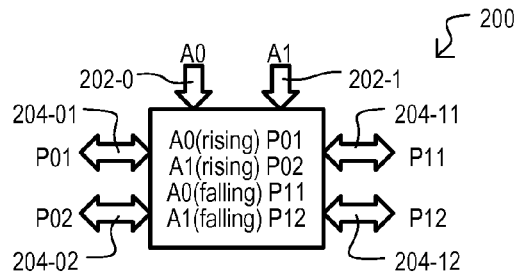
FIG. 2A
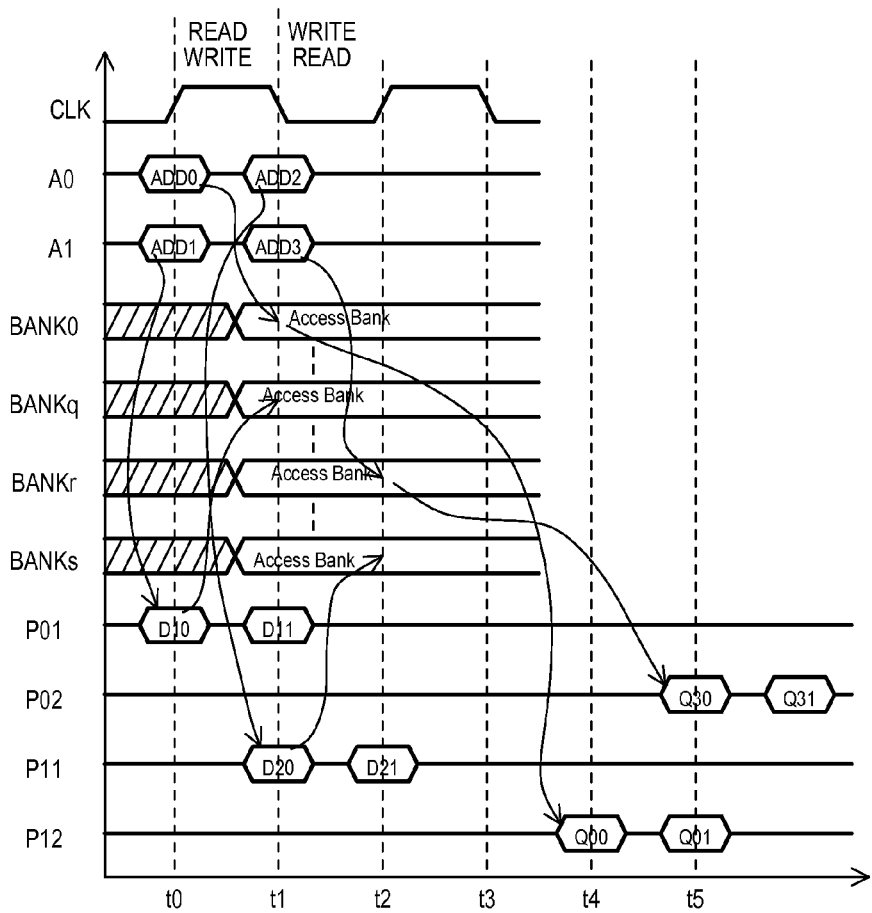
FIG. 2B
FIG. 2C

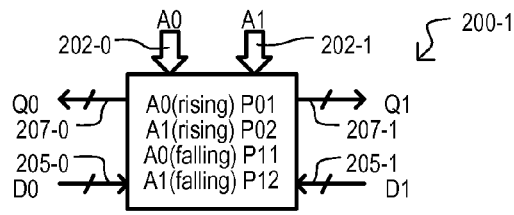
FIG. 2D
| | B2A4b |
|---|---|
| DATA BURST | 2 |
| #ADD/CYCLE | 4 banked |
| # READ PORTS | 2 |
| # WRITE PORTS | 2 |
| BANKS | 2/4/8 |
| R_W/CYCLE/BANK | 2 |
FIG. 2E
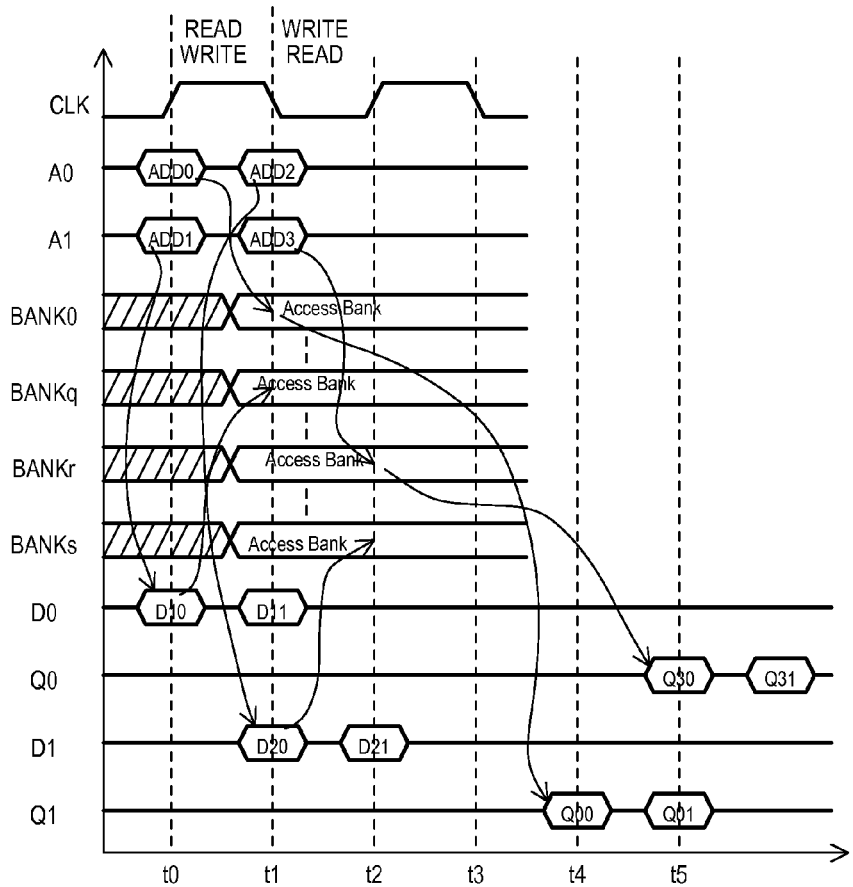
FIG. 2F

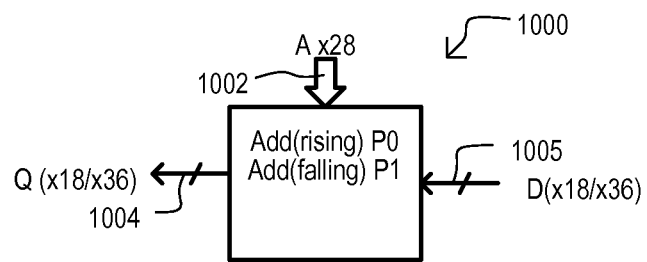
FIG. 10A
(BACKGROUND ART)
|  | B4A1 | B2A2 |
|---|---|---|
| DATA BURST | 4 | 2 |
| #ADD/CYCLE | 1(ave) | 2 |
| # READ PORTS | 1 | 1 |
| # WRITE PORTS | 1 | 1 |
| I/O WIDTH | x18, x36 | x18, x36 |
FIG. 10B
(BACKGROUND ART)
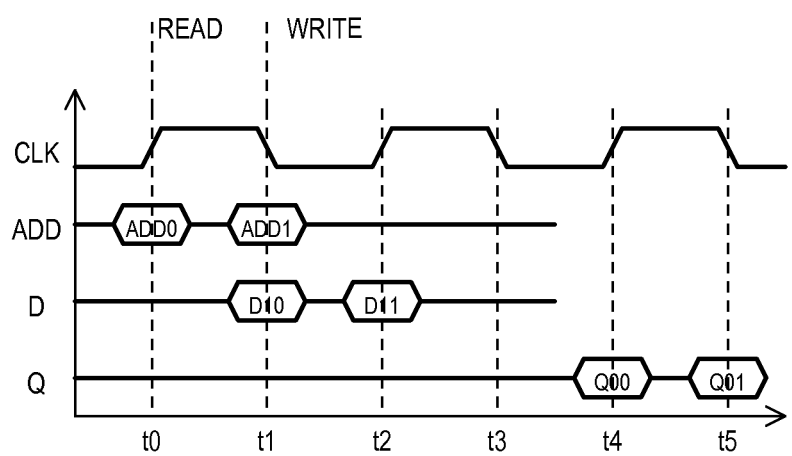
FIG. 10C
(BACKGROUND ART)

MEMORY DEVICES AND METHODS HAVING MULTIPLE ADDRESS ACCESSES IN SAME CYCLE

This application claims the benefit of U.S. provisional patent application Ser. No. 61/363,151 filed on Jul. 9, 2010, the contents of which are incorporated by reference herein.

TECHNICAL FIELD

The present disclosure relates generally to memory devices, and more particularly to synchronous memory devices that access memory locations based on one or more timing clock signals.

BACKGROUND

FIG. 10A is a block diagram of a conventional memory device 1000. A conventional memory device can be a quad data rate (QDR) type static random access memory (SRAM) type device, such as that manufactured by Cypress Semiconductor Corporation of San Jose, Calif., U.S.A. Conventional memory device 1000 can include one address port 1002, a read data port (Q) 1004 and a write data port (D) 1005. An address port 1002 can be a 28-bit wide address port (×28), while data ports (1004, 1005) can be 18-bit or 36-bit wide data ports. It is understood that data ports (1004, 1005) are unidirectional ports, providing one-way input or output data paths. Operations for conventional memory device 1000 are shown in FIGS. 10B and 10C.

FIG. 10B is a table showing two possible conventional modes of operation shown as B4A1 and B2A2. In the table, "DATA BURST" shows how long a data burst (set of consecutive data values) can be in the mode. "#ADD/CYCLE" shows the number of addresses received in a timing cycle. "# READ PORTS" shows the number of available read ports. "# WRITE PORTS" shows the number of available write ports "I/O WIDTH" shows a bit width for data values.

Mode B4A1 involves a burst of four data values in response to a single address value. In such a mode, a memory device can read or write a burst of four data values at one bank in response to one address.

Mode B2A2 involves bursts of data values, each in response to one of two address values. In such a mode, a memory device can read or write two bursts of two data values in response to two addresses.

FIG. 10C is a timing diagram showing one example of a B2A2 type mode of operation. At time t0, a read operation can start with a first address value (ADD0) being latched on a rising edge of a timing clock CLK. Subsequently, at times t4 and t5 a burst of two data values Q00 and Q01 can be output on a read port Q.

At time t1, a write operation can start with a second address value (ADD1) being latched on a falling edge of timing clock CLK. At the same time, a first write data value (D10) of a two value burst can be provided on write port D. At time t2, a second write data value (D11) of the burst can be provided on write port D.

BRIEF DESCRIPTION OF THE DRAWINGS

FIGS. 1A to 1C show a memory device including bidirectional data ports and corresponding methods according to one embodiment.

FIGS. 1D to 1F show a memory device including unidirectional data ports and corresponding methods according to one embodiment.

FIGS. 2A to 2C show a memory device including four bidirectional data ports and corresponding methods according to further embodiments.

FIGS. 2D to 2F show a memory device including four unidirectional data ports and corresponding methods according to further embodiments.

FIGS. 10A to 10C show a conventional memory device and method.

DETAILED DESCRIPTION

Figure 3A:
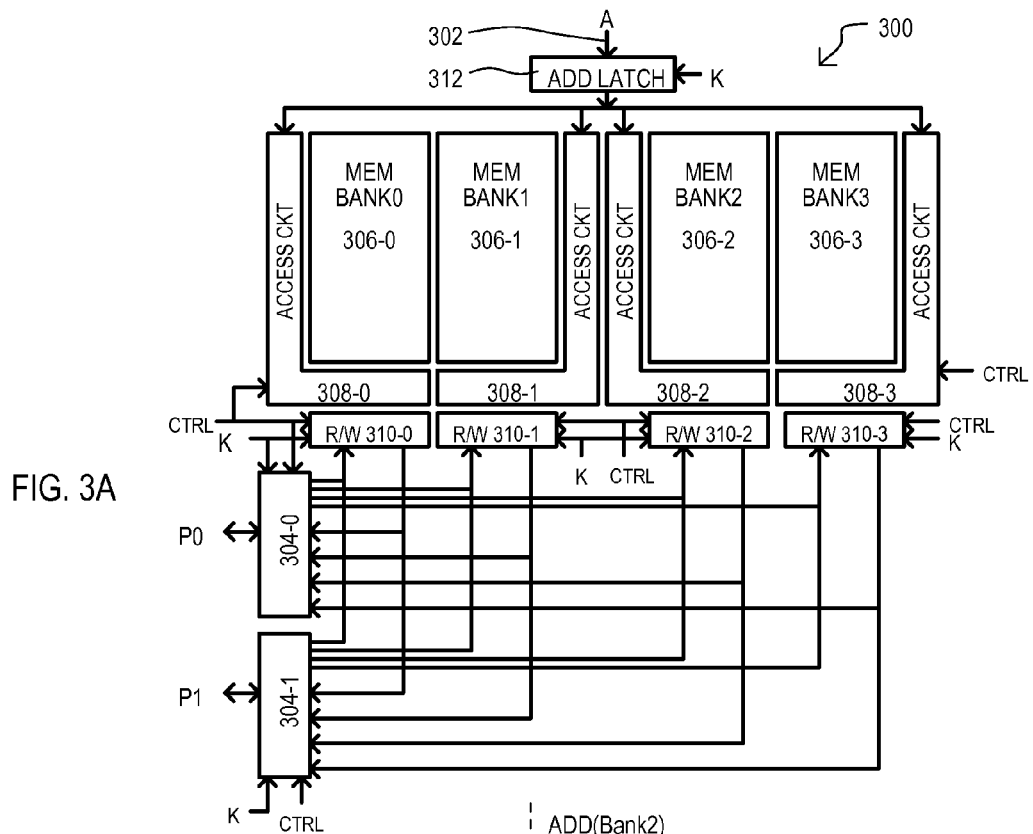
FIGS. 3A and 3B are block schematic diagrams showing a memory device receiving address values on different consecutive edges of a clock signal and corresponding methods according to further embodiments.

Various embodiments will now be described that include memory devices and methods in which different banks of a memory device can be accessed by way of address values received on both rising and falling edges of a timing signal. In some embodiments, addresses can be received by way of a single address port. However, in other embodiments, addresses can be received on different edges of a timing signal on more than one address port. Such high random access capabilities can provide advantageous memory responses in systems having a high transaction rate requirement.

In the various embodiments shown herein, like sections may be referred to by the same reference characters, but with the leading digit(s) corresponding to the figure number.

Referring now to FIG. 1A, a memory device according to a first embodiment is shown in a block schematic diagram and designated by the general reference character 100. A memory device 100 can include an address port 102, a first read/write (R/W) data port (P0) 104-0, and a second R/W data port (P1) 104-1. An address port 102 can receive addresses on both rising and falling edges of a timing clock, with each received address indicating an access via one of the ports (104-0/1). An address port can be a multi-bit port for receiving addresses that indicate an accessed data location (or the starting location of a burst access). Each R/W data port (P0, P1) 104-0/1 can provide a read data path and a write data path to storage locations within memory device 100.

FIG. 1B is a table showing one operation of a memory device like that of FIG. 1A, according to an embodiment. The mode is labeled "B2A2b", and shows bursts-of-two in response to two addresses, but with the two addresses being directed to different banks within the memory device. In the table, "DATA BURST" shows that the operation can provide bursts of two data values. "#ADD/CYCLE" shows that two addresses can be received in one timing clock cycle (but such addresses can correspond to different banks). "# I/O PORTS" shows the number of available R/W data ports. "BANKS" shows the number of banks that can be accessed by read or write operations. In the particular embodiment shown, a memory device can include two, four or eight banks. "R_W/CYCLE/BANK" shows the number of read or write operations that per cycle that can occur in a bank. As shown, one operation occurs per bank. However, it is understood that two different banks can be accessed per cycle.

FIG. 1C is a timing diagram showing one example of a B2A2b type mode according to one particular embodiment. At time t0, a read operation can start with a first address value (ADD0) being received on a rising edge of a timing clock CLK. In response to the address value, BANK0 can be accessed, with a burst of two data values (Q00, Q01) being output at times t4 and t5.

At time t1, a write operation can start with a second address value (ADD1) being received on a falling edge of timing clock CLK. Also at time t1, a first write data value (D10) of two value burst can be provided on R/W port P1. At time t2, a second write data value (D11) of a burst can be provided on R/W port P1. In response to address ADD1, write data values (D10/D11) can be written to a different bank (BANKx) than that accessed by the read operation.

It is understood that while FIG. 1C shows a read operation followed by a write operation, other operation combinations could be executed. That is, in response to addresses on rising and falling (or vice versa) edges of a timing clock, two read (or write) operations to different banks can be executed.

In this way, in response to address values received on consecutive rising and falling edges of a clock, a memory device may access two or more different banks with read or write operations.

While the embodiments of FIGS. 1A to 1C show a memory device having bi-directional data buses, alternate embodiments may include unidirectional data ports, as shown in FIGS. 1D to 1F.

Referring now to FIG. 1D, a memory device according to another embodiment is shown in a block schematic diagram and designated by the general reference character 100-1. Unlike FIG. 1A, memory device 100-1 can have a unidirectional read data port (Q) 107 and a unidirectional write data port 105.

FIG. 1E is a table showing one operation of a memory device like that of FIG. 1D. FIG. 1E shows the same information as FIG. 1B, but indicates that a device can include one read port (# READ PORTS) and one write port (# WRITE PORTS).

FIG. 1F is a timing diagram showing one example of a B2A2b type mode according to one particular embodiment. The timing diagram can be understood with reference to FIG. 1C, it being understood that read data values are output on unidirectional read data port Q, and write data values are input on unidirectional write data port D.

In this way, in response to address values received on consecutive rising and falling edges of a clock, a memory device may access two or more different banks with read or write operations, with data passing along on unidirectional data ports.

It is noted that in the embodiments herein, address values received on different clock edges are complete logical addresses. That is, such addresses do not present only a portion of address to access a storage location (e.g., are not only a column address, or only a row address).

It is also noted that for embodiments shown herein that include bi-directional data ports (R/W data ports), alternate versions of such embodiments can include such bi-directional data ports being configurable to operate as unidirectional data port. Such configurability can be via a fabrication step (e.g., fusible links, bonding option) or programming operations, as but two examples.

Referring now to FIG. 2A, a memory device according to another embodiment is shown in a block schematic diagram and designated by the general reference character 200. A memory device 200 can include multiple address ports and more than two R/W data ports. In the particular embodiment shown, memory device 200 can include two address ports A0 and A1 (shown as 202-0 and -1, respectively) and four R/W data ports P01, P02, P11 and P12 (shown as 204-01, -02, -11, -12, respectively).

Each address port (202-0/1) can receive addresses on both rising and falling edges of a timing clock, with each received address indicating an access via one of any of the R/W data ports (204-01 to -12). An address port can take the form of those shown in the embodiments herein, and equivalents. As in the case of FIG. 1A, each R/W data port (204-01 to -12) can provide a read data path and a write data path to storage locations within memory device 200. In particular embodiments, any of multiple banks within memory device can be accessed by any of the R/W data ports (204-01 to -12).

FIG. 2B is a table showing one operation of a memory device like that of FIG. 2A. The mode is labeled "B2A4b", and shows bursts-of-two in response to four different addresses, with such addresses being directed to different banks within the memory device. As shown, "DATA BURST" indicates that the operation can provide bursts of two data values. "#ADD/CYCLE" shows that four addresses can be received in one timing clock cycle, with each different address corresponding to a different bank. "# I/O PORTS" shows that four R/W ports can be provided. Like FIG. 2B, "BANKS" shows that number of banks that can be accessed can be any of two, four or eight. "R_W/CYCLE/BANK" shows that the number of read or write operations per cycle that can occur in a bank is two.

FIG. 2C is a timing diagram showing one example of a B2A4b mode of operation according to one particular embodiment. At time t0, a read operation can start with a first address value (ADD0) being received on a rising edge of a timing clock CLK on a first address port A0. At the same time, a write operation can start with a second address value (ADD1) being received on the rising edge of CLK on a second address port A1. In response to ADD0, BANK0 can be accessed, and a burst of data values (Q00, Q01) can be output on port P12 at times t4 and t5. In response to ADD1, BANKq can be accessed, and data values (D10, D11) on port P01 can be written into BANKq.

At time t1, a write operation can start with a third address value (ADD2) being received on a falling edge of a timing clock CLK on first address port A0. At the same time, a read operation can start with a fourth value (ADD3) being received on the falling edge of CLK on second address port A1. In response to ADD2, BANKs can be accessed, and data values (D20, D21) on port P11 can be written into the bank. In response to ADD3, BANKr can be accessed, and a burst of data values (Q30, Q31) can be output on port P02 starting at time t5.

As in the case of FIG. 1C, it is understood that while FIG. 2C shows a read/write pair followed by a write/read pair, other operation combinations could be executed (i.e., read/read pairs, write/write pairs, etc.).

In this way, in response to address values received on consecutive rising and falling edges of a clock at multiple address ports, a memory device may access two or more different banks with read or write operations.

While the embodiments of FIGS. 2A to 2C show a memory device having bi-directional data buses, alternate embodiments may include unidirectional data ports, as shown in FIGS. 2D to 2F.

Referring now to FIG. 2D, a memory device according to another embodiment is shown in a block schematic diagram and designated by the general reference character 200-1. Unlike FIG. 1A, memory device 200-1 can have multiple, unidirectional read data ports (two in this embodiment) (Q0/Q1) 207-0/1 and multiple, unidirectional write data ports 205-0/1.

FIG. 2E is a table showing one operation of a memory device like that of FIG. 2D. FIG. 2E shows the same information as FIG. 2B, but indicates that a device can include two read ports (# READ PORTS) and two write ports (# WRITE PORTS).

FIG. 2F is a timing diagram showing one example of a B2A2b type mode according to one particular embodiment. The timing diagram can be understood with reference to FIG. 2C, it being understood that read data values are output on unidirectional read data ports Q0/Q1, and write data values are input on unidirectional write data ports D0/D1.

In this way, in response to address values received on consecutive rising and falling edges of a clock, a memory device may access two or more different banks with read or write operations, with data passing along on multiple, unidirectional, read and write data ports.

As noted above, in some embodiments, bi-directional data ports can be configured for unidirectional operation. Further, while the embodiments show matching numbers of unidirectional read and write ports, some embodiments can include different numbers of read ports versus write ports.

Figure 3B:
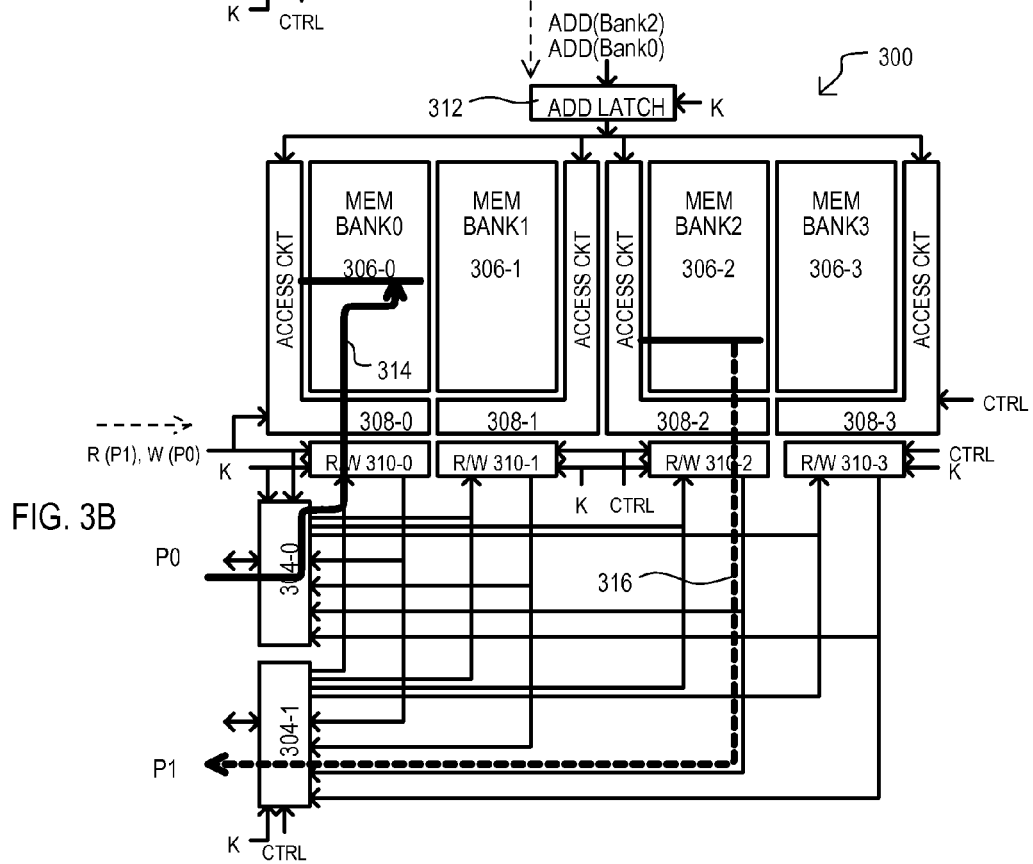

FIGS. 3A and 3B show a memory device and corresponding operations according to additional embodiments. FIGS. 3A and 3B shows a memory device 300 in a block schematic diagram that includes an address port 302, R/W data ports 304-0/1, memory banks 306-0 to -3, access circuits 308-0 to -3, R/W circuits 310-0/1 and an address latch 312. FIGS. 3A and 3B can show one very particular implementation of memory device 100 shown in FIG. 1A.

Address port 302 can receive address values as described herein and equivalents. Addresses received on address port 302 can be latched within address latch 312 on rising and falling edges of a timing clock K. Addresses stored in address latch 312 can be provided to access circuits 308-0 to -3.

Memory banks 306-0 to -3 can include storage locations accessible in response to received addresses. Storage locations within memory banks (306-0 to -3) can be accessed by corresponding access circuits (308-0 to -3). In the embodiment shown, each access circuit (308-0 to -3) enables access to its corresponding memory bank (306-0 to -3), and not to any other memory bank. Such access can be based on a received address and control values CTRL. Further, an address value received on address port 302 can indicate one particular bank. Access circuits (308-0 to -3) can provide burst accesses, which can access more than one storage location according to a predetermined sequence.

R/W circuits 310-0 to -3 can enable data values to be read from, or written into, locations within memory banks 306-0 to -3, respectively. R/W circuits (310-0 to -3) can be controlled by control signals CTRL, and can perform burst read and/or writes in response to such control signals.

R/W data ports 304-0/1 can provide read and write data paths to any of memory banks (306-0 to -3) by way of corresponding R/W circuits 310-0 to -3. In the embodiment shown, R/W data ports 304-0/1 can operate in synchronism with timing clock K. In alternate embodiments, any or all of R/W data ports 304-0/1 can be configured to operate in a unidirectional mode. Similarly, in alternate embodiments, any or all of data ports 304-0/1 may fabricated as unidirectional data ports. In such cases, write data paths need not be provided for a read port, and read data paths need not be provided for write data ports.

FIG. 3B shows an example of operations in a memory device 300. In particular, FIG. 3B shows memory device 300 operations in response to receiving address values ADD (Bank0) ADD(Bank2) on different consecutive edges of a clock signal K. In conjunction with address ADD(Bank0), memory device 300 can receive a write command directed to port P0 (W(P0)). In conjunction with address ADD (Bank2), memory device 300 can receive a read command directed to port P1 (R(P1)).

In response to address ADD(Bank0) and command W(P0), access circuits 308-0 can enable a write path to storage locations within memory bank 306-0 (shown by solid bold line 314). Write data on port P0 can be written by R/W circuits 310-0 into memory bank 306-0.

In response to address ADD(Bank2) and command R(P1), access circuits 308-2 can enable a read path from storage locations within memory bank 306-2 (shown by dashed bold line 316). Read data at the accessed location within memory bank 306-2 can be output on port P1 via R/W circuit 310-2.

Figure 4:
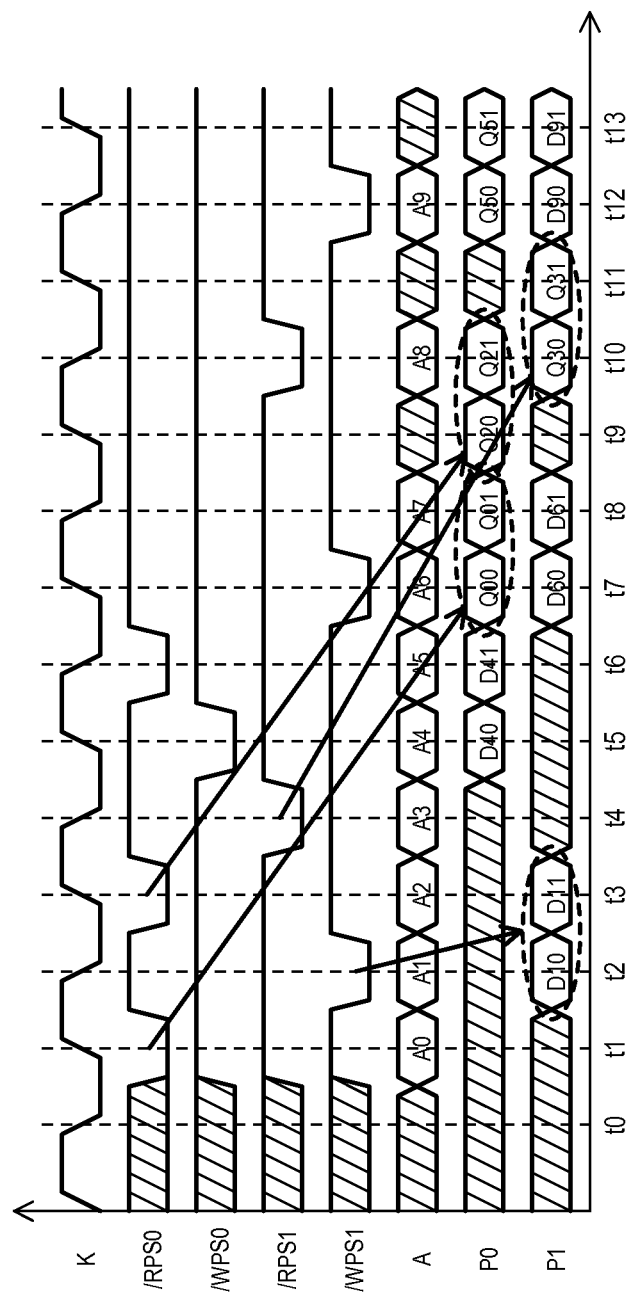
FIG. 4 is a timing diagram showing timing operations of a memory device according to embodiments.

FIG. 4 is a timing diagram showing one example of operations that can occur in a memory device like that shown in FIGS. 3A and 3B. In FIG. 4, waveform K shows a periodic clock signal that can establish timing for operations. Waveform/RPS0 can be a read pulse signal (active low) for a first port P0, and waveform/WPS0 can be a write pulse signal (active low) for first port P0. Thus, a state of such signals can indicate a read or write operation at port P0. In a similar fashion, waveform/RPS1 can be a read pulse signal for a second port P1, and waveform/WPS1 can be a write pulse signal for second port P1. Thus, a state of such signals can indicate a read or write operation at port P1.

Waveform A shows address values received at an address port.

Waveforms P0 and P1 show responses at two R/W ports.

At about time t1, address A0 can be received on a rising edge of clock K. At the same time, /RPS0 can be low, indicating a read operation out of port P0. Consequently, data values Q00 and Q01 can be output at times t7 and t8, respectively.

At about time t2, address A1 can be received on a falling edge of clock K. At the same time, /WPS1 can be low, indicating a write operation via port P1. Thus, write data D10 and D11 can be presented at port P1 at times t2 and t3.

It is understood that addresses A0 and A1 can be to different banks within a memory device.

At about time t3, address A2 can be received on a rising edge of clock K. At the same time, /RPS0 can be low, indicating another read operation out of port P0. Consequently, data values Q20 and Q21 can be output at times t9 and t10, respectively.

It is understood that addresses A1 and A2 can be to different banks within a memory device.

At about time t4, address A3 can be received on a falling edge of clock K. At the same time, /RPS1 can be low, indicating a read operation out of port P1. Consequently, data values Q30 and Q31 can be output at times t10 and t11, respectively.

It is understood that addresses A2 and A3 can be to different banks within a memory device.

FIG. 4 shows various other operations and corresponding responses at various ports. Such additional operations would be understood from the description of the other operations above. The particular read latency times (time between read address and output data) are but one example, other embodiments can have faster or slower read latencies. It is understood that the particular control signals (/RPS0, /WPS0, /RPS1, /WPS1) shown in FIG. 4 are but one embodiment. Alternate embodiments may have different command formats suitable for a given memory interface.

Figure 5A:
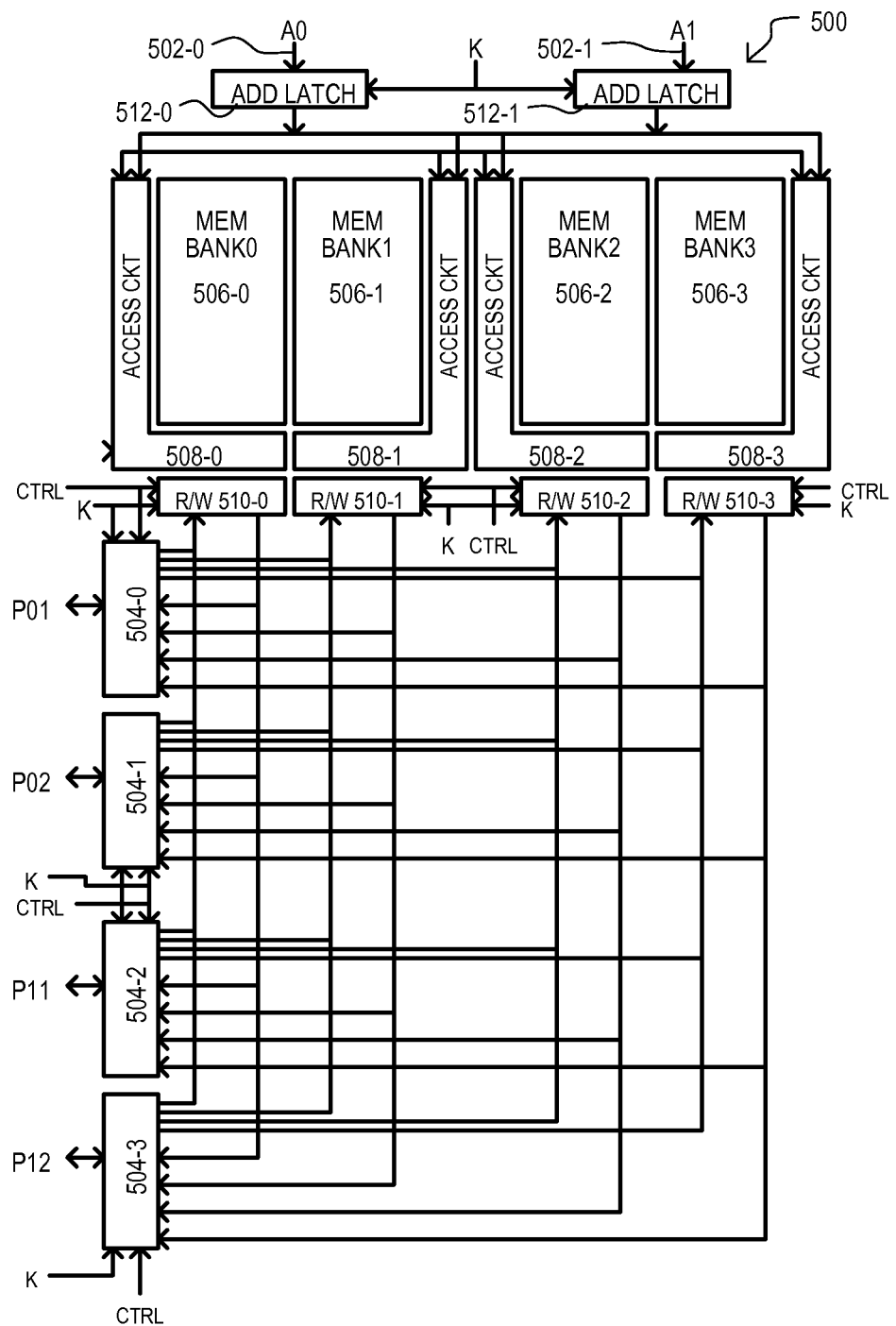
FIGS. 5A and 5B are block schematic diagrams showing a memory device having two address ports, two address latches, and four data ports and corresponding methods according to additional embodiments.
Figure 5B:
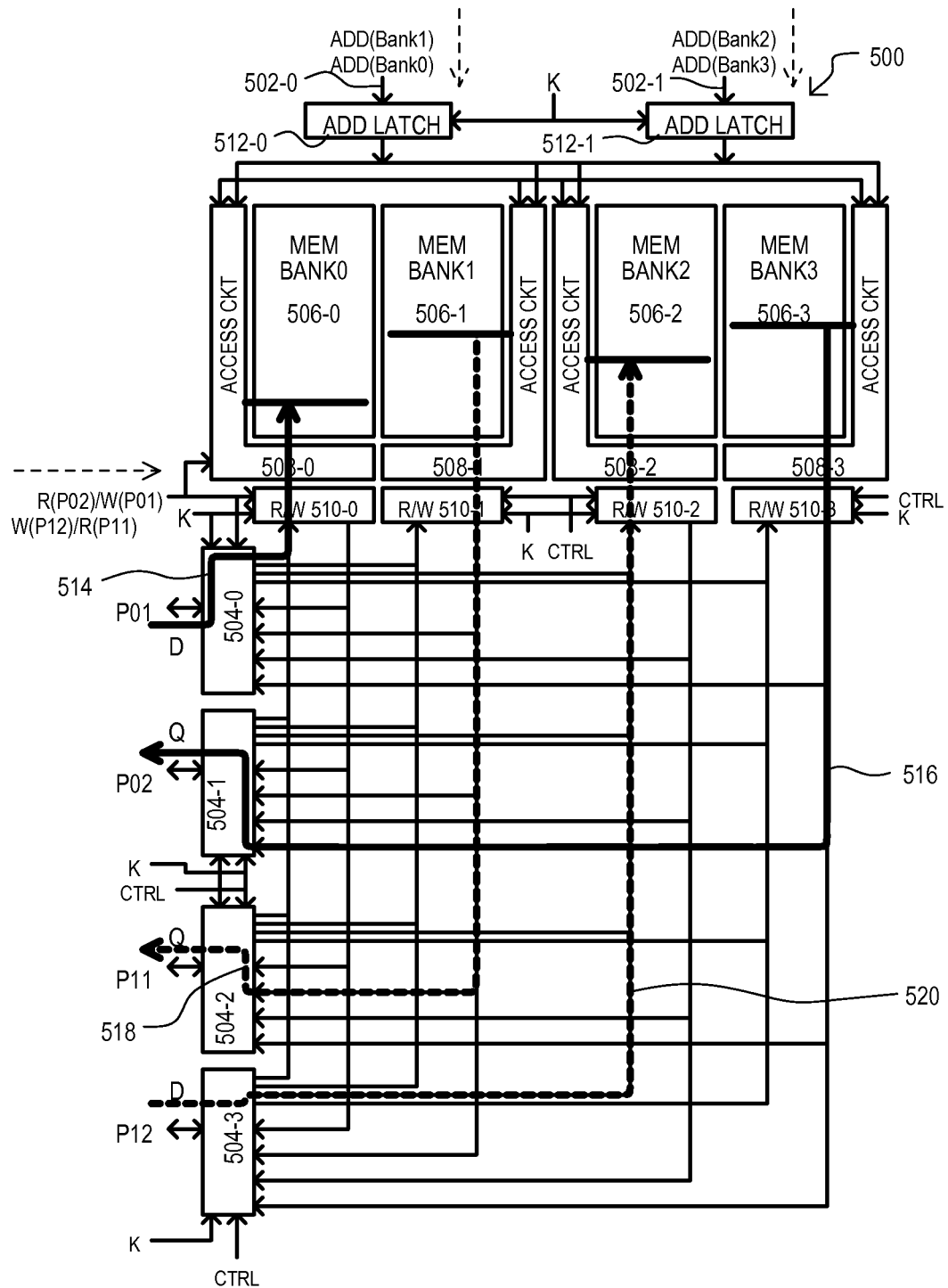

FIGS. 5A and 5B show a memory device and operations according to further embodiments. FIGS. 5A/B show a memory device 500 having sections like those of FIGS. 3A and 3B.

Referring to FIG. 5A, memory device 500 can differ from that of FIGS. 3A/B in that it can include two address ports A0/1 (502-0, 502-1), two address latches (512-0, 512-1), and four R/W data ports 504-0 to -3. FIG. 5A can be one very particular implementation of memory device 200 shown in FIG. 2A.

Address ports 502-0/1 can receive address values as described herein and equivalents. Received addresses can be stored in address latches 512-0/1 on rising and falling edges of clock signal K. Thus, memory device 500 can be capable of receiving four different addresses in a single clock cycle. Each of address latches 512-0/1 can provide address values to all access circuits 508-0 to -3. Accordingly, an address received on either address port 502-0/1 can enable access to any of memory banks 506-0 to -3.

R/W data ports (P01, P02, P11, P12) 504-0 to -3 can provide read and write data paths to any of memory banks (506-0 to -3) by way of corresponding R/W circuits 510-0 to -3. In the embodiment shown, R/W data ports 504-0/1 can operate in synchronism with timing clock K. As in the case of FIG. 3A, in alternate embodiments, any or all of R/W data ports 504-0 to -3 can be configured to operate in a unidirectional mode. Similarly, in alternate embodiments, any or all of data ports 504-0/1 may be fabricated as unidirectional data ports. In such cases, write data paths need not be provided for a read port, and read data paths need not be provided for write data ports.

FIG. 5B shows examples of operations in a memory device 500. In particular, FIG. 5B shows a response of memory device 500 to receiving address value ADD(Bank0) on first address port 502-0, along with address value ADD (Bank3) on second address port 502-1. Such address values can be received on a same edge of a clock signal K. Corresponding to address ADD(Bank0) can be a write command to port P01 (W(P01)). Correspond to address ADD(Bank 3) can be a read command from port P02 (R(P02)).

In response to address/command pair ADD(Bank0)/W (P01), access circuits 508-0 can enable a write path to storage locations within memory bank 506-0 (shown by solid bold line 514). Write data on port P01 can be written by R/W circuits 510-0 into memory bank 506-0.

In response to address/command pair ADD(Bank3)/R (P02), access circuits 508-3 can enable a read path from storage locations within memory bank 506-3 (shown by solid bold line 516). Read data at the accessed location within memory bank 506-3 can be output on port P02 via R/W circuit 510-3.

FIG. 5B further shows a response of memory device 500 to receiving address value ADD(Bank1) on first address port 502-0, and address value ADD(Bank2) on second address port 502-1. Such address values can be received on a clock signal edge one half-cycle following address values ADD (Bank0) and ADD(Bank3). Corresponding to address ADD (Bank1) can be a read command at port P11 (R(P11)). Correspond to address ADD(Bank2) can be a write command to port P02 (W(P12)).

In response to address/command pair ADD(Bank1)/R (P11), access circuits 508-1 can enable a read path from storage locations within memory bank 506-1 (shown by dashed bold line 518). Read data at the accessed location within memory bank 506-1 can be output on port P11 via R/W circuit 510-1.

In response to address/command pair ADD(Bank2)/W (P12), access circuits 508-2 can enable a write path to storage locations within memory bank 506-2 (shown by dashed bold line 520). Write data on port P12 can be written by R/W circuits 510-2 into memory bank 506-2.

Figure 6:
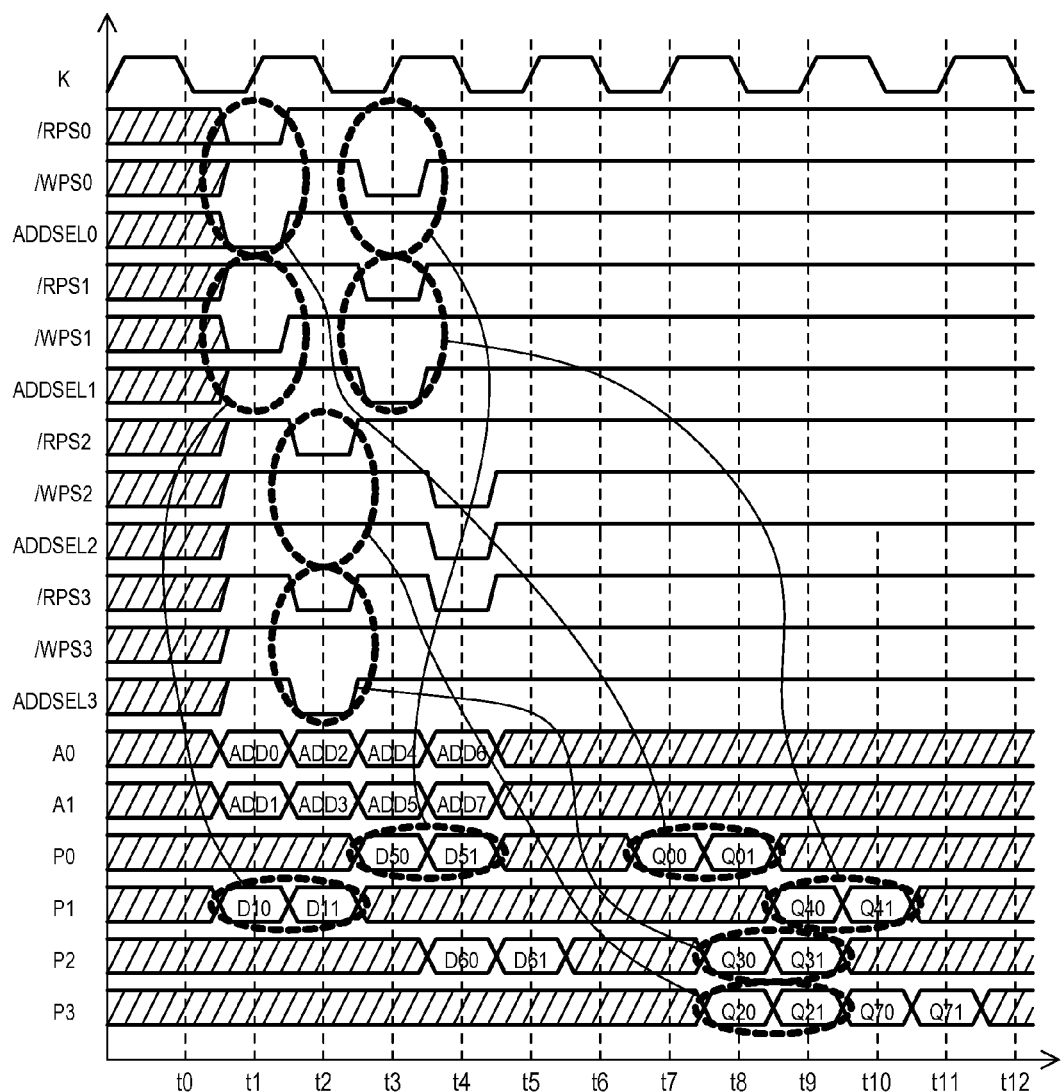
FIG. 6 is a timing diagram showing timing operations of a memory device according to additional embodiments.

FIG. 6 is a timing diagram showing examples of operations that can occur in a memory device like that shown in FIGS. 5A and 5B. In FIG. 6, waveform K shows a periodic clock signal that can establish timing for operations of the memory device. Waveform/RPS0 can be a read pulse signal (active low) for a first port P0, waveform/WPS0 can be a write pulse signal (active low) for first port P0, and waveform ADDSEL0 can be an address port select signal (active low). The state of such signals can indicate a read or write operation at port P0. A same set of signals can be provided for three other ports (i.e., /RPS1, /WPS1, ADDSEL1 for port P1; /RPS2, /WPS2, ADDSEL2 for port P2; /RPS3, /WPS3, ADDSEL3 for port P3).

Waveform A0 shows address values received at a first address port. Waveform A1 shows address values received at a second address port. Waveforms P0, P1, P2, and P3 show responses at four R/W data ports.

At about time t1, address ADD0 can be received at address port A0 and address ADD1 can be received at address port A1, both on a rising edge of clock K. At the same time, /RPS0 can be low, indicating a read operation out of port P0. ADDSEL0 can be low, indicating that the port P0 access is in response to address ADD0. Also at time t1, /WPS1 can be low, indicating a write operation at port P1. ADDSEL1 can be high, indicating that the port P1 access is in response to address ADD1.

In response to /RPS0, ADDSEL0 and ADD0 at time t1, data values Q00 and Q01 can be output at times t7 and t8. In addition, in response to /WPS1, ADDSEL1 and ADD1 at time t1, data values D10 and D11, provided at port P1, can be written into locations corresponding to address ADD1.

At about time t2, address ADD2 can be received at address port A0 and address ADD3 can be received at address port A1, both on a falling edge of clock K. At the same time, /RPS2 can be low, indicating a read operation out of port P2. ADDSEL2 can be high, indicating that the port P2 access is in response to address ADD3. Also at time t2, /RPS3 can be low, indicating a read operation from port P3. ADDSEL3 can be low, indicating that the port P3 access is in response to address ADD2.

In response to /RPS2, ADDSEL2 and ADD3 at time t2, data values Q30 and Q31 can be output at times t8 and t9 on port P2. Similarly, in response to /RPS3, ADDSEL3 and ADD2 at time t2, data values Q20 and Q21 can be output at times t8 and t9 on port P3.

At about time t3, address ADD4 can be received at address port A0 and address ADD5 can be received at address port A1, both on a rising edge of clock K. At the same time, /WPS0 can be low, indicating a write operation at port P0. ADDSEL0 can be high, indicating that the port P0 access is in response to address ADD5. Also at time t3, /RPS1 can be low, indicating a read operation from port P1. ADDSEL1 can be low, indicating that the port P1 access is in response to address ADD4.

In response to /WPS0, ADDSEL0 and ADD5 at time t3, data values D50 and D51 can be written to address values corresponding to ADD5. In addition, in response to /RPS1, ADDSEL1 and ADD4 at time t3, data values Q40 and Q41 can be output on port P1 at times t9 and t10.

Like FIG. 4, FIG. 6 shows various other operations and corresponding responses at various ports. Such additional operations would be understood from the description of the other operations above. Further, the particular read latency times and particular control signal sets are but one embodiment. Alternate embodiments may have different command formats suitable for a given memory interface.

While the above embodiments have shown memory devices and methods, additional embodiments will now be described with reference to flow diagrams.

Figure 7:
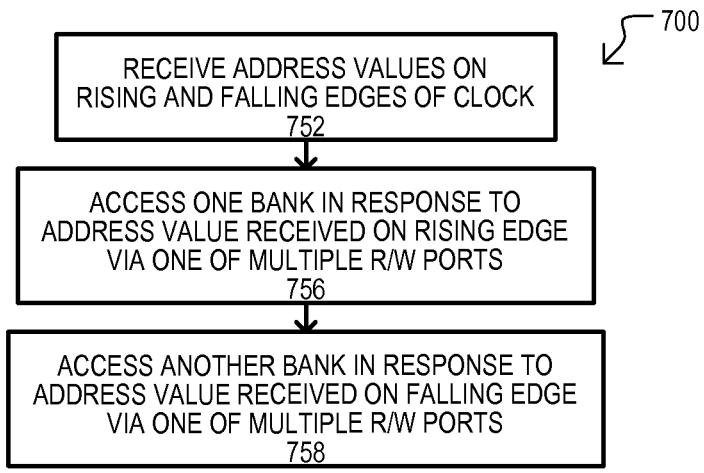
FIG. 7 is a flow diagram of a method for receiving address values on rising and falling edges of a clock according to one embodiment.

FIG. 7 shows a method 700 that can include receiving address values on rising and falling edges of a clock (752). One bank can be accessed in response to an address value received on a rising edge of the clock. Such an access can be by way of one of multiple R/W data ports (756). Another bank can be accessed in response to an address value received on a falling edge of the clock. Such an access can be by way of one of multiple R/W data ports (758).

Figure 8:
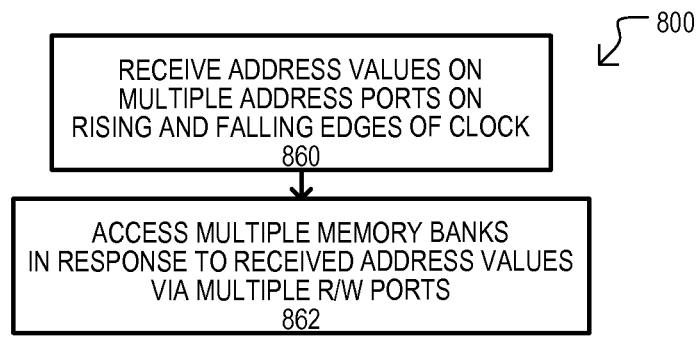
FIG. 8 is a flow diagram of a method for receiving address values on rising and falling edges of a clock on multiple address ports according to a further embodiment.

FIG. 8 shows another method 800 that an include receiving address values on multiple address ports on rising and falling edges of a clock (860). Multiple memory banks can be accessed in response to the received address values. Such accesses can be by way of multiple R/W data ports 862).

Memory banks according to the various embodiments can include storage locations formed by various memory cell types. However, particular embodiments can be based on static random access memory (SRAM) architectures. FIGS. 9A to 9E show particular structures that may be included in some embodiments.

Figure 9A:
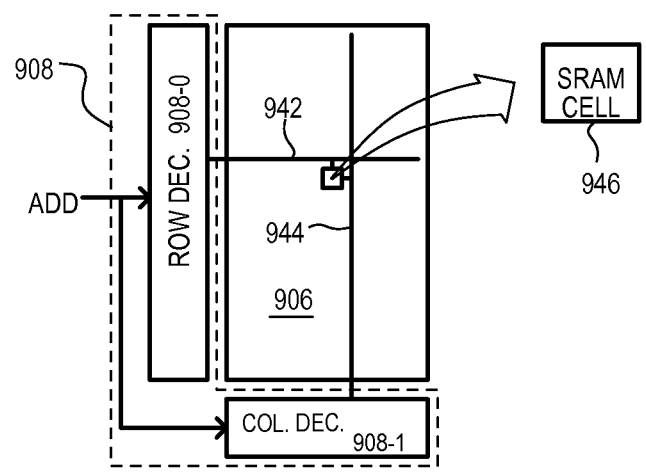
FIGS. 9A to 9E show static random access memory (SRAM) structures that can be included in the embodiments.

FIG. 9A shows a memory bank 906 and corresponding access circuit 908. A memory bank 906 can include a number of word lines (one shown as 942) and a number of bit lines (one shown as 944). Memory cells (one shown as 946) can be formed at the intersection of such bit and word lines. In the particular embodiment shown, memory cells of memory bank 906 can be SRAM cells. Word lines can be activated by a row decoder 908-0 in response to address data. Access to bit lines can be enabled by column decoder 908-1.

Figure 9B:
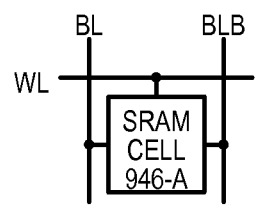

FIG. 9B shows one example of an SRAM cell 946-A that can be included in embodiments. SRAM cell 946-A can be connected to complementary bit lines BL/BLB in response to activation of a word line WL. Thus, a read operation, a differential signal can be generated across bit line pair BL/BLB.

Figure 9C:
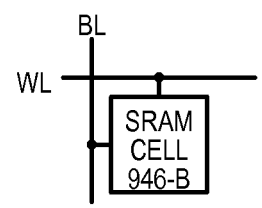

FIG. 9C shows another example of an SRAM cell 946-B that can be included in embodiments. SRAM cell 946-B can be single ended, being connected to one bit lines BL in response to activation of a word line WL.

Figure 9D:
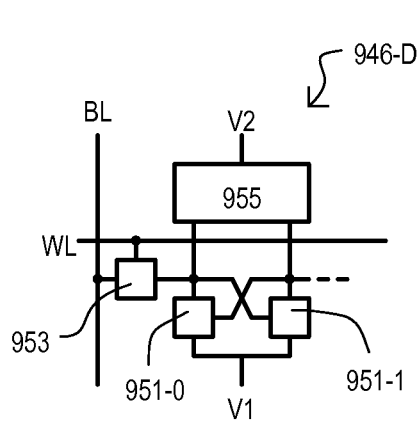

FIG. 9D shows a further example of an SRAM cell 946-C. SRAM cell 946-C can include cross-coupled latching devices 951-0/1, access device 953, and a load 955. Latching devices (951-0/1) and access devices 953 can be active circuit elements, such as transistors. A load 955 can be a static load or an active load.

Figure 9E:
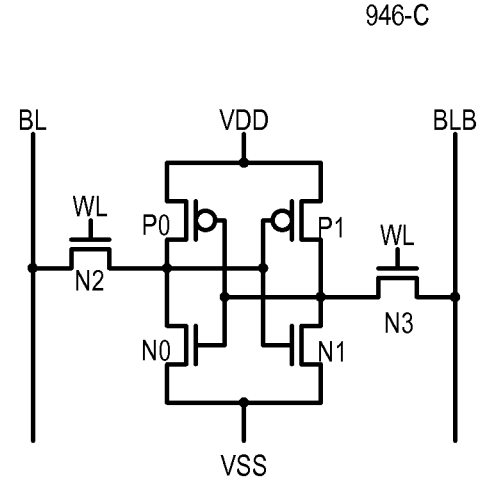

FIG. 9E shows another example of an SRAM cell 946-D that can be included in embodiments. SRAM cell 946-D can be a 6-transistor cell implemented with CMOS technology.

Memory devices and methods as disclosed herein can enable high rates of random transactions by enabling different banks to be accessed according address values received at a high rate (e.g., double data rate addresses). This is in contrast to conventional approaches that may limit accesses to a single bank.

While memory devices and methods according to the embodiments shown herein may provide advantages in various applications, in particular embodiments, a memory device can be a network memory device utilized in systems that process packet data. Network memory devices according to embodiments can be utilized to perform various operations, including lookup operations that can enable a processor device to rapidly and randomly access portions of packet data distributed over multiple memory banks. Such data can be compared against other data values and ranged to determine how a packet is to be processed. Such a capability can allow for rapid forwarding, longest prefix matching, and access control determinations to be made by a processor coupled to a memory device according to an embodiment.

Other operations of a network memory device according to embodiments can include packet statistic/counter transactions and/or flow/state transactions that update values indicating size and number of packets, status of packets, and/or composition and status of packet flows. Embodiments may also execute scheduler operations, which can control the queuing and de-queuing of packets by a system.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed:

1. A memory device, comprising:
   a plurality of banks including a first bank and a second bank, each bank including a plurality of memory locations;
   at least a first address port configured to receive a first address corresponding to a first read operation on a rising edge of a timing clock, and further configured to receive a second address corresponding to a second read operation on a falling edge of the timing clock, the first read operation and the second read operation being received by the first address port on consecutive edges of a same cycle of the timing clock, the first address corresponding to a first location in the first bank, and the second address corresponding to a second location in the second bank; and at least two read/write data ports, each configured to transfer read or write data for storage in one of the banks, and output read data from one of the banks, wherein each of the at least two read/write data ports is configured to provide a read data path and a write data path to each bank of the plurality of banks via a plurality of read/write circuits and access circuits coupled between the plurality of banks and the at least two read/write data ports, each access circuit and read/write circuit being configured to enable reading data values from a bank to the at least two read/write data ports, and being further configured to enable writing data values from the at least two read/write data ports to the bank, wherein the plurality of read/write circuits and access circuits are controlled by control signals identifying read and write pulse signals for each of the at least two read/write data ports, and wherein the at least two read/write data ports and the first address port are controlled by the same timing clock.

2. The memory device of claim 1, wherein:
the read/write data ports are double data rate ports configured to receive write data on rising and falling edges of the timing clock.

3. The memory device of claim 1, wherein:
the read/write data ports are double data rate ports configured to output read data on rising and falling edges of the timing clock.

4. The memory device of claim 1, wherein:
the number of banks is selected from two, four and eight.

5. The memory device of claim 1, wherein the memory device further includes
a second address port also configured to receive addresses on falling and rising edges of the timing clock that correspond to locations in different banks.

6. The memory device of claim 5, wherein:
the memory banks each comprise a plurality of static random access memory cells.

7. The memory device of claim 1, wherein:
each access circuit is configured to access a burst of at least two data storage locations in response to one received address value.

8. A memory device, comprising:
a plurality of banks including a first bank and a second bank, each bank including a plurality of memory locations;

at least two address ports, each address port configured to latch, on a rising edge of a periodic timing signal, a first address value corresponding to a first read operation associated with the first bank, and further configured to latch, on a falling edge of the periodic timing signal, a second address value corresponding to a second read operation associated with the second bank, the rising edge associated with the first read operation and the falling edge associated with the second read operation being consecutive edges of a same cycle of the periodic timing signal; and a plurality of data ports, at least one data port configured to transfer read data or output read data on different transitions of the periodic timing signal, wherein each data port of the plurality of data ports is configured to provide a read data path and a write data path to each bank of the plurality of banks via a plurality of read/write circuits and access circuits coupled between the plurality of banks and the plurality of data ports, each access circuit and read/write circuit being configured to enable reading data values from a bank to the plurality of data ports, and being further configured to enable writing data values from the plurality of data ports to the bank, wherein the plurality of read/write circuits and access circuits are controlled by control signals identifying read and write pulse signals for each of the plurality of data ports, and wherein the plurality of data ports and the at least two address ports are controlled by the same timing clock.

9. The memory device of claim 8, wherein:
each address port is configured to latch address values corresponding to different banks on consecutive, different, transitions of the periodic timing signal.

10. The memory device of claim 8, wherein:
at least one of the data ports is configured to latch write data on different transitions of the periodic timing signal.

11. The memory device of claim 8, wherein:
the data ports are read/write data ports, each configured to latch write data and output read data on different transitions of the periodic timing signal.

12. The memory device of claim 8, further including:
at least two address latches configured to latch received address values on different transitions of the periodic timing signal, each address latch being coupled to the access circuits of each bank.

13. The memory device of claim 8, wherein:
the access circuits are configured to access sequential data locations of the respective bank in burst access operations.

14. The memory device of claim 8, wherein:
the banks comprise static random access memory cells.

15. A method, comprising:
accessing different banks of a memory device via a plurality of data ports in response to addresses corresponding to read operations received on at least a first address port, each data port of the plurality of data ports providing a read data path and a write data path to each bank of the different banks via a plurality of read/write circuits and access circuits coupled between the different banks and the plurality of data ports, each access circuit and read/write circuit enabling the reading of data values from a bank to the plurality of data ports, and further enabling writing data values from the plurality of data ports to the bank, the plurality of read/write circuits and access circuits being controlled by control signals identifying read and write pulse signals for each of the plurality of data ports, and the plurality of data ports and the first address port being controlled by the same timing clock, the addresses including a first address and a second address, the first address corresponding to a first read operation associated with a first bank, the second address corresponding to a second read operation associated with a second bank, and the first address and the second address being received by the first address port on consecutive rising and falling edges of a same cycle of a periodic timing signal.

16. The method of claim 15, wherein:
accessing different banks of the memory device includes, in a read operation, outputting data on the data ports on consecutive rising and falling edges of the periodic timing signal.

17. The method of claim 15 further comprising:
accessing the different banks of the memory device in a write operation; and
latching data on the data ports on consecutive rising and falling edges of the periodic timing signal.

18. The method of claim 15, further including:
accessing different banks of the memory device in response to no less than four addresses received within one cycle of the periodic timing signal.

19. The method of claim 18, further including:
receiving two address values on consecutive rising and falling edges of a periodic timing signal on the first address port; and
receiving two address values on consecutive rising and falling edges of the periodic timing signal on a second address port.

20. The method of claim 18, further including:
providing no less than four data read/write ports for accessing the different banks of the memory device.

21. The memory device of claim 1, wherein the timing clock is a periodic clock signal configured to establish one or more timings for at least the first operation and the second operation.

22. The method of claim 15, wherein the periodic tuning signal is a periodic clock signal configured to establish one or more timings for at least the first operation and the second operation.

\* \* \* \* \*